United States Patent
Hanaoka et al.

(10) Patent No.: US 7,067,929 B2
(45) Date of Patent: Jun. 27, 2006

(54) SEMICONDUCTOR WAFER, SEMICONDUCTOR DEVICE, CIRCUIT BOARD, ELECTRONIC INSTRUMENT, AND METHOD FOR MANUFACTURING SEMICONDUCTOR DEVICE

(75) Inventors: Terunao Hanaoka, Suwa (JP); Yasunori Kurosawa, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/801,093

(22) Filed: Mar. 15, 2004

(65) Prior Publication Data
US 2004/0245621 A1 Dec. 9, 2004

(30) Foreign Application Priority Data
Mar. 20, 2003 (JP) ............... 2003-078096
Nov. 14, 2003 (JP) ............... 2003-385420

(51) Int. Cl.
*H01L 23/48* (2006.01)
(52) U.S. Cl. .................. 257/784; 257/737; 257/738
(58) Field of Classification Search ............... 257/784, 257/738
See application file for complete search history.

(56) References Cited

U.S. PATENT DOCUMENTS

| | | | |
|---|---|---|---|
| 5,266,501 A * | 11/1993 | Imai | 436/60 |
| 5,677,566 A | 10/1997 | King et al. | |
| 6,287,893 B1 * | 9/2001 | Elenius et al. | 438/108 |
| 6,323,542 B1 | 11/2001 | Hashimoto | |
| 6,387,808 B1 * | 5/2002 | Schiltz et al. | 438/689 |
| 6,455,408 B1 * | 9/2002 | Hwang et al. | 438/613 |
| 6,518,162 B1 | 2/2003 | Ono et al. | |
| 2002/0008320 A1 * | 1/2002 | Kuwabara et al. | 257/738 |
| 2002/0167013 A1 * | 11/2002 | Iwasaki et al. | 257/79 |

FOREIGN PATENT DOCUMENTS

| | | |
|---|---|---|
| JP | 11-297873 | 10/1999 |
| JP | 2003-209137 | 7/2003 |
| WO | WO00/55898 | 9/2000 |

* cited by examiner

*Primary Examiner*—Nathan J. Flynn
*Assistant Examiner*—Benjamin P. Sandvik
(74) *Attorney, Agent, or Firm*—Hogan & Hartson LLP

(57) ABSTRACT

A method for manufacturing a semiconductor device includes the steps of (a) forming a wiring layer on a semiconductor substrate having an integrated circuit and a pad electrically connected to the integrated circuit, the wiring layer being electrically connected to the pad, (b) forming a resin layer covering the wiring layer, (c) forming a first concave portion at an area of the resin layer, the area overlapping the wiring layer, by a first process, (d) forming a through-hole in the resin layer by removing a bottom of the first concave portion by a second process, the second process differing from the first process, and forming a second concave portion in the wiring layer in such a way that an angle between an osculating plane at any point of a surface of the second concave portion and a top surface of the wiring layer, with the angle being defined outside the second concave portion is 90° or more and (e) providing an external terminal in the second concave portion of the wiring layer.

30 Claims, 6 Drawing Sheets

$90 \leq \alpha$ $90 \leqq \beta$

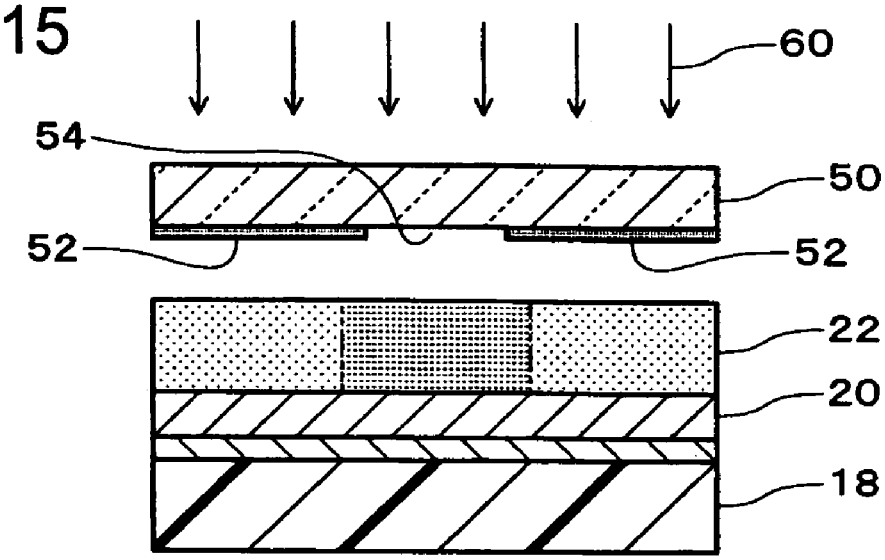
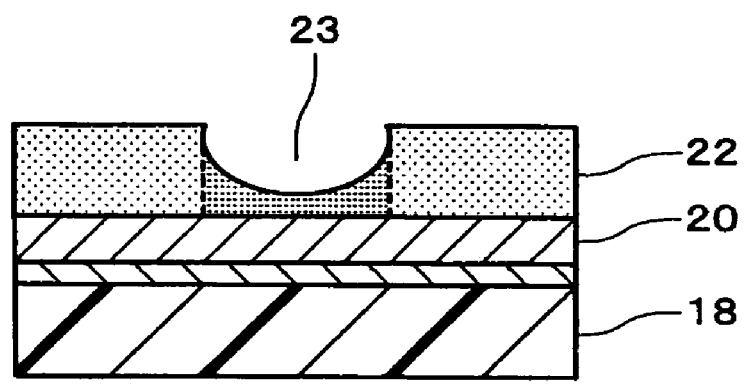

SEMICONDUCTOR WAFER, SEMICONDUCTOR DEVICE, CIRCUIT BOARD, ELECTRONIC INSTRUMENT, AND METHOD FOR MANUFACTURING SEMICONDUCTOR DEVICE

BACKGROUND OF THE INVENTION

1. Field of the Invention

The present invention relates to a semiconductor wafer, a semiconductor device, a circuit board, an electronic instrument, and a method for manufacturing a semiconductor device.

2. Description of Related Art

In semiconductor devices, surface mount packages, which meet the demands for ease of mounting and high-density packaging, are known. In chip scale/size package (CSP) technology, for example, a wiring layer may be formed on a semiconductor chip with a resin layer therebetween, and an external terminal (e.g., a solder ball) may be provided thereon. Conventionally, it has been required to keep the wiring layer from having a form leading to a break resulting from the process of providing the external terminal.

An advantage of the present invention is to avoid breaks in the wiring layer.

SUMMARY OF THE INVENTION

A method for manufacturing a semiconductor device according to an aspect of the present invention includes forming a wiring layer on a semiconductor substrate having an integrated circuit and a pad electrically connected to the integrated circuit. The wiring layer is electrically connected to the pad. The method also includes forming a resin layer covering the wiring layer, forming a first concave portion at an area of the resin layer, where the area overlaps the wiring layer, by a first process, forming a through-hole in the resin layer by removing the bottom of the first concave portion by a second process, the second process differing from the first process, and forming a second concave portion in the wiring layer in such a way that an angle between an osculating plane at any point of a surface of the second concave portion and a top surface of the wiring layer, with the angle being defined outside the second concave portion, being 90° or more and providing an external terminal in the second concave portion of the wiring layer. According to this aspect of the present invention, the second concave portion is formed in a way described above so that breaks in the wiring layer are reduced.

In this method for manufacturing the semiconductor device, the first concave portion may be formed in such a way that an angle between an osculating plane at any point of a surface of the first concave portion and a top surface of the resin layer, with the angle being defined outside the first concave portion, is 90° or more.

The method includes the resin layer may be formed of a thermosetting resin precursor and the thermosetting resin precursor may be heated, the resin layer may be formed of a resin precursor that is sensitive to radiation, and the first process may include irradiation with the radiation and development of the resin precursor and the second process may include dry etching.

In this method for manufacturing a semiconductor device, the resin layer may be formed of a solder resist, the first concave portion may have a curved outline at a cross section taken along a plane perpendicular to a top surface of the resin layer, the second concave portion may have a curved outline at a cross section taken along a plane perpendicular to a top surface of the wiring layer, the first concave portion may have a width that decreases with depth, the second concave portion may have a width that decreases with depth and the second concave portion may be formed in such a way that an opening thereof is entirely disposed inside the through-hole.

A semiconductor device according to an aspect of the present invention includes a semiconductor chip having an integrated circuit and a pad electrically connected to the integrated circuit, and a wiring layer electrically connected to the pad and having a concave portion, the concave portion being formed in such a way that an angle between an osculating plane at any point of a surface of the concave portion and a top surface of the wiring layer with the angle being defined outside the concave portion, is 90° or more. The device also includes an external terminal joined to the concave portion of the wiring layer and a resin layer provided on the wiring layer. The resin layer has a through-hole and the through-hole and the concave portion overlapping each other. According to this aspect of the present invention, the concave portion is formed in a way described above so that breaks in the wiring layer are reduced.

According to an embodiment of the present invention, the concave portion may have a curved outline at a cross section taken along a plane perpendicular to a top surface of the wiring layer, the concave portion may have a width that decreases with depth, the concave portion may be formed in such a way that an opening thereof is entirely disposed inside the through-hole, the external terminal may contact the through-hole in the resin layer, a stress relief layer may be formed on or above the semiconductor chip, wherein the wiring layer may be formed on or above the stress relief layer, and the resin layer may be formed of a solder resist.

A circuit board according to an aspect of the present invention includes the semiconductor device described above and an electronic instrument according to an aspect of the present invention includes the semiconductor device described above.

A semiconductor wafer according to an aspect of the present invention includes a semiconductor substrate having a plurality of integrated circuits and pads electrically connected to the plurality of integrated circuits. A wiring layer is electrically connected to the pads and has concave portions with the concave portions being formed in such a way that an angle between an osculating plane at any point of a surface of each of the concave portions and a top surface of the wiring layer with the angle being defined outside each of the concave portions, is 90° or more. External terminals are joined to the concave portions in the wiring layer and a resin layer is provided on the wiring layer with the resin layer having through holes. The through holes and the concave portions overlapping each other. According to this aspect of the present invention, the concave portion is formed in a way described above so that breaks in the wiring layer are reduced.

In this semiconductor wafer, each of the concave portions may have a curved outline at a cross section taken along a plane perpendicular to a top surface of the wiring layer, each of the concave portions may have a width that decreases with depth, the concave portions may be formed in such a way that openings thereof are entirely disposed inside the through holes and the external terminals may contact the through holes in the resin layer.

This semiconductor wafer may further include a stress relief layer formed on or above the semiconductor substrate, wherein the wiring layer may be formed on or above the stress relief layer and the resin layer may be formed of a solder resist.

BRIEF DESCRIPTION OF THE DRAWINGS

FIG. 15 is an illustration explaining a method for manufacturing a semiconductor device according to a modification of the first embodiment of the present invention.

FIG. 16 is an illustration explaining the method for manufacturing the semiconductor device according to the modification of the first embodiment of the present invention.

DETAILED DESCRIPTION OF THE PREFERRED EMBODIMENTS

Embodiments of the present invention will now be illustrated with reference to the drawings.

Figure 1:
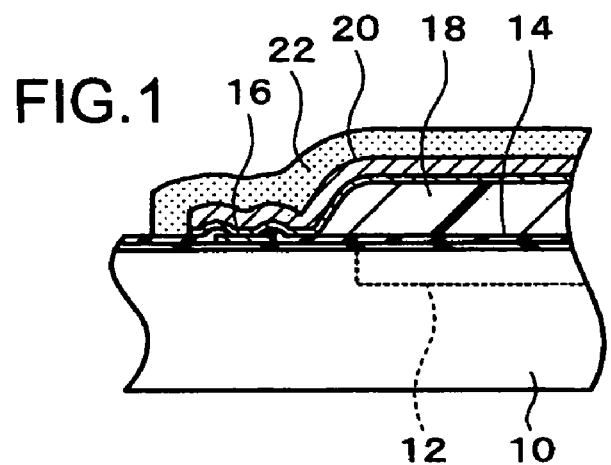
FIG. 1 is an illustration explaining a method for manufacturing a semiconductor device according to an embodiment of the present invention.

FIGS. 1 to 7 and FIGS. 13 to 16 illustrate the method for manufacturing a semiconductor device according to embodiments of the present invention. As shown in FIG. 1, a semiconductor substrate 10 is used in these embodiments. The semiconductor substrate 10 includes one or more integrated circuits 12. When the semiconductor substrate 10 is cut into a plurality of semiconductor chips, the semiconductor substrate 10 includes a plurality of the integrated circuits 12, and each semiconductor chip has a corresponding integrated circuit 12.

A passivation film 14 may be formed on the surface of the semiconductor substrate 10. The passivation film 14 may be formed of an inorganic material, such as silicon dioxide ($SiO_2$) or silicon nitride (SiN). The passivation film 14 may be composed of a plurality of layers. In this case, at least one layer (e.g., a surface layer) may be formed of an organic material. On the surface of the semiconductor substrate 10, pads 16 are formed. The pads 16 are electrically connected to the integrated circuits 12 (e.g., semiconductor integrated circuits). The passivation film 14 is formed away from at least the middle sections of the pads 16.

A stress relief layer 18 may be formed on or above the semiconductor substrate 10. The stress relief layer 18 may be formed by applying a resin precursor (e.g., a thermosetting resin precursor) to the semiconductor substrate 10 or by spreading the resin precursor on the semiconductor substrate 10 by spin coating. The stress relief layer 18 may be composed of a single sublayer or a plurality of sublayers. The stress relief layer 18 is an electrically insulating layer. The stress relief layer 18 may be formed of polyimide resin, silicone-modified polyimide resin, epoxy resin, silicone-modified epoxy resin, benzocyclobutene (BCB), polybenzoxazole (PBO), or the like. The stress relief layer 18 does not include conductive particles. The stress relief layer 18 may be formed of a light-shielding material.

The stress relief layer 18 may be formed of a radiation-sensitive resin precursor, which is sensitive to radiation (light rays including ultraviolet rays and visible rays, X-rays, or electron beams). Radiation-sensitive resin precursors (e.g., photosensitive resin precursors) can be classified into a negative type and a positive type. For the negative type, the regions irradiated with radiation become less soluble or become insoluble. For the positive type, the regions irradiated with radiation become more soluble.

The stress relief layer 18 may be formed away from the pads 16 and may be formed away from areas used for cutting the semiconductor substrate 10. The stress relief layer 18 may be subjected to patterning after being formed consecutively or integrally on or above the semiconductor substrate 10. The stress relief layer 18 may be formed at each of a plurality of areas (the areas where the plurality of integrated circuits 12 are formed) in the semiconductor substrate 10. In this case, the stress relief layer 18 and the adjacent stress relief layer 18 are separated.

A wiring layer 20 is formed on the stress relief layer 18. The wiring layer 20 may be composed of a single sublayer or a plurality of sublayers. The wiring layer 20 may be formed, for example, by depositing a titanium tungsten (TiW) sublayer and a copper (Cu) sublayer by sputtering and then by applying a copper coating to the composite to form a copper sublayer. The wiring layer 20 may be formed in a known manner. The wiring layer 20 is formed over the pads 16 (so as to electrically connect to the pads 16). The wiring layer 20 is formed over the pads 16 and the stress relief layer 18. The wiring layer 20 may have a land (a section having greater width than a trace) for setting external terminals 28 thereon.

A first resin layer 22 is formed on the stress relief layer 18. In the present invention, the first resin layer 22 may be of a resin precursor (uncured or unpolymerized state) or of a resin (cured or polymerized). The first resin layer 22 may be formed of a solder resist. The first resin layer 22 covers the wiring layer 20 (e.g., entirely). The first resin layer 22 may cover the stress relief layer 18 (e.g., completely). The first resin layer 22 may expose the areas used for cutting the semiconductor substrate 10 (away from the areas used for cutting). The first resin layer 22 does not include conductive particles. The first resin layer 22 may be formed of a light-shielding material. The first resin layer 22 may be subjected to patterning after being formed consecutively or integrally on the semiconductor substrate 10. The first resin layer 22 may be formed at each of the plurality of areas (the areas where the plurality of integrated circuits 12 are formed) in the semiconductor substrate 10. In this case, the first resin layer 22 and an adjacent first resin layer 22 are separated.

The first resin layer 22 may be formed of a thermosetting resin precursor or a radiation-sensitive resin precursor (e.g., photosensitive resin precursor), which is sensitive to radiation (light rays including ultraviolet rays and visible rays, X-rays, or electron beams).

Figure 2:
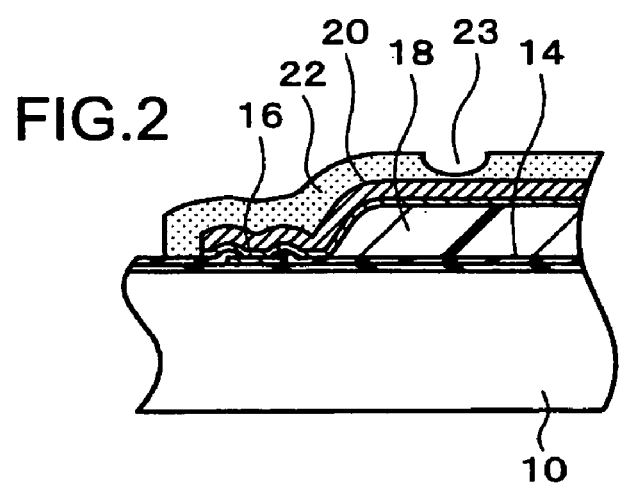
FIG. 2 is an illustration explaining a method for manufacturing the semiconductor device according to an embodiment of the present invention.

As shown in FIG. 2, first concave portions 23 are formed in the first resin layer 22. The first concave portions 23 are formed at areas of the first resin layer 22 which overlap the wiring layer 20 (e.g., a land). The first concave portions 23 are formed by a first process. The first process may include lithography. For example, the first resin layer 22 may be formed of the radiation-sensitive resin precursor, and then irradiated with radiation and subjected to patterning (e.g., development). Radiation-sensitive resin precursors (e.g., photosensitive resin precursors) can be classified into a negative type and a positive type. For the negative type, the regions irradiated with radiation (e.g., light) become less soluble or become insoluble. For the positive type, the regions irradiated with radiation (e.g., light) become more soluble.

Figure 13:
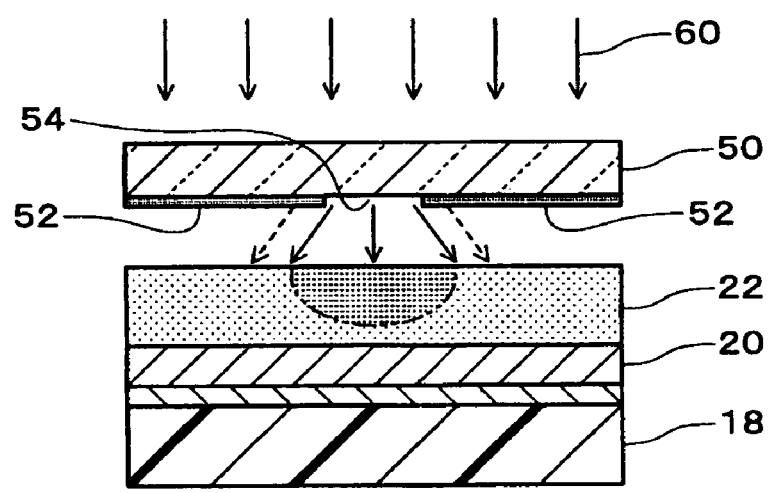
FIG. 13 is an illustration explaining a method for manufacturing a semiconductor device according to a first embodiment of the present invention.

The process of forming the first concave portions 23 (the first process) will now be described in detail. In an embodiment shown in FIGS. 13 and 14, the first concave portions 23 are formed by reducing a dose of radiation in an exposure step (e.g., by reducing the irradiation time or the intensity of light). As shown in FIG. 13, a mask 50 is provided above the first resin layer 22. Through the mask 50, the first resin layer 22 is irradiated with radiation 60. In this embodiment, a positive-type radiation-sensitive resin precursor is used as an example. The mask 50 has a shielding section 52 that cannot transmit the radiation 60 and a transparent section 54 that can transmit the radiation 60. The mask 50 may include a glass substrate, through which the first resin layer 22 is irradiated with the radiation 60.

Figure 14:
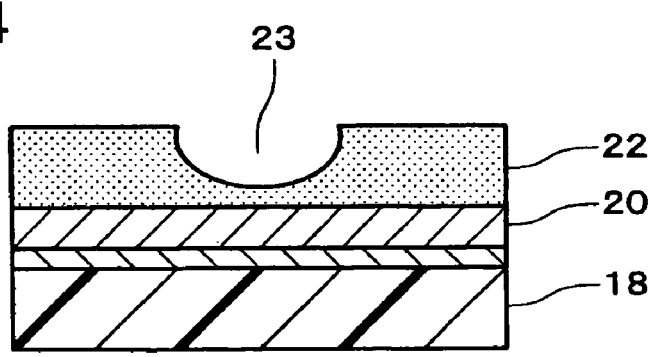
FIG. 14 is an illustration explaining the method for manufacturing the semiconductor device according to the first embodiment of the present invention.

In this step, a dose of the radiation 60 is lower than that in a normal case (e.g., a case where the first resin layer 22 has a hole with straight walls). The radiation 60 thus does not reach the bottom of the first resin layer 22 (the part in contact with the wiring layer 20). The first resin layer 22 is irradiated with the radiation 60 from not only a right angle but also oblique angles. The perpendicular component of the radiation 60 incident at a right angle reaches the first resin layer 22, corresponding to a pattern of the mask 50 (the pattern defined by the transparent section 54). Oblique components of the radiation 60 incident at oblique angles reach the first resin layer 22, being deflected at the boundaries between the shielding section 52 and the transparent section 54 of the mask 50. In areas of the first resin layer 22 directly below the shielding section 52 and transparent section 54 of the mask 50, the radiation 60 incident on the first resin layer 22 gradually decreases from an area corresponding to the center of the transparent section 54 to an area corresponding to the shielding section 52 and thus the depth of the irradiation with the radiation 60 in the first resin layer 22 gradually decreases as such. In this way, a region of the first resin layer 22 whose solubility is increased by the irradiation with the radiation 60 takes a concave shape. After that, in a development step, the region of the first resin layer 22 having increased solubility is dissolved and removed, thus forming the first concave portions 23, as shown in FIG. 14.

FIGS. 15 and 16 show a modification of the process of forming the first concave portions 23 (the first process). In this modification, the first concave portions 23 are formed by reducing the solubility during development (e.g., by reducing the development time or the concentration of a developer) in a development step. First, an exposure step is performed, as shown in FIG. 15. The description given above for the above-described embodiment (see FIG. 13) is applicable to this step, except that a sufficient dose of the radiation 60 (e.g., a dose capable of forming a hole having straight walls) is supplied. The radiation 60 thus reaches the bottom of the first resin layer 22 (the part in contact with the wiring layer 20). The first resin layer 22 is irradiated with the radiation 60 in an area overlapping the transparent section 54. As shown in FIG. 15, the area irradiated with the radiation 60 of the first resin layer 22 may have a width greater than a width of the transparent section 54 because of the oblique angles of incidence to the first resin layer 22. After that, in a development step, a region of the first resin layer 22 having increased solubility is dissolved. In this modification, since the solubility during development is reduced, only a part of the region of the first resin layer 22 having increased solubility is removed, as shown in FIG. 16. A developer penetrates from a surface of the first resin layer 22 (the surface remote from the wiring layer 20), and the depth of the developer penetrated gradually decreases from the center to the edge of the region having increased solubility in the first resin layer 22. In this way, the first concave portions 23 are provided, as shown in FIG. 16.

Even after completing normal exposure and the development steps, typically, the first resin layer 22 has no straight walls in the opening and resin remains in the opening so that the thickness of the remaining resin increases from the center to the edge of the opening. This remaining resin may form the first concave portions 23.

Figure 3:
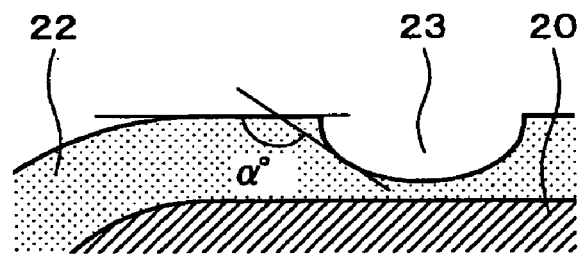
FIG. 3 is an enlarged cross-sectional view of a first concave portion.

FIG. 3 is an enlarged cross-sectional view of one of the first concave portions 23. Each of the first concave portions 23 may be formed in such a way that an angle α between an osculating plane at any point of a surface (a tangent at a cross section) of each of the first concave portions 23 and a top surface (a tangent at a cross section) of the first resin layer 22 (specifically, the edge of the opening of each of the first concave portions 23), with the angle α being defined outside each of the first concave portions 23, is 90° or more. Each of the first concave portions 23 may have a curved outline, as shown in FIG. 3, at a cross section taken along a plane perpendicular to a top surface of the first resin layer 22 (specifically, the edge of the opening of each of the first concave portions 23). Each of the first concave portions 23 may have a surface with a gentle curve or have a width that decreases with depth. Each of the first concave portions 23 may have no corners in its surface.

Figure 4:
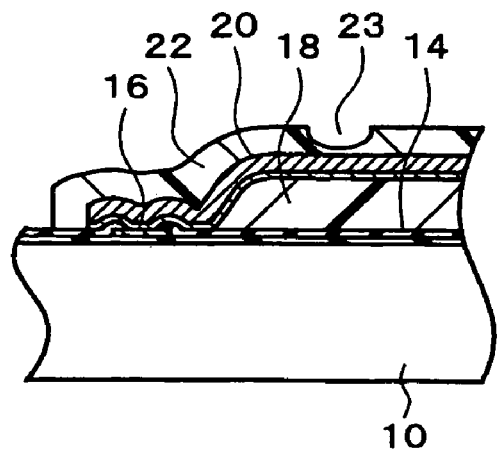
FIG. 4 is an illustration explaining a method for manufacturing the semiconductor device according to an embodiment of the present invention.

As shown in FIG. 4, the first resin layer 22 is cured. The curing process may include a passivation of the wiring layer 20 (e.g., formation of an oxide film). For example, the first resin layer 22 formed of a thermosetting resin precursor is cured (polymerized) by heat. In this embodiment, it is possible to prevent the wiring layer 20 from being passivated during the curing of the first resin layer 22, because the first resin layer 22 is not exposed, although it has the first concave portions 23. Therefore, a step for activating the wiring layer 20 can be eliminated, thereby simplifying the entire process.

Figure 5:
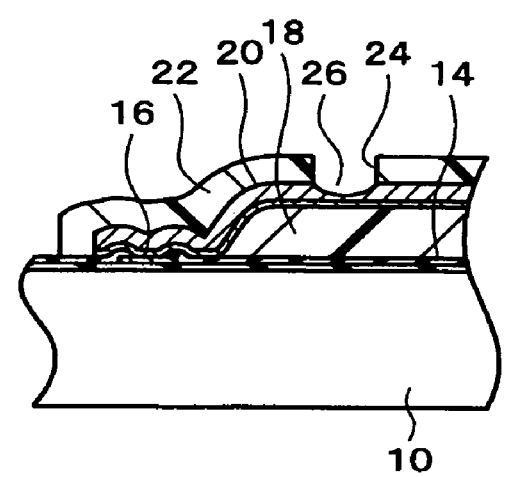
FIG. 5 is an illustration explaining a method for manufacturing the semiconductor device according to an embodiment of the present invention.

As shown in FIG. 5, through holes 24 are formed in the first resin layer 22, after the first resin layer 22 is cured, by removing the bottoms of the first concave portions 23. The through holes 24 are formed by a second process. The second process differs from the first process of forming the first concave portions 23. The second process may be, for example, dry etching.

Second concave portions 26 are formed in the wiring layer 20. The second concave portions 26 may overlap the through holes 24. The second concave portions 26 may be formed in such a way that their openings are entirely disposed inside the through holes 24. The second concave portions 26 may be formed by etching (e.g., dry etching). The process of forming the second concave portions 26 may be the same as that of the through holes 24. The second concave portions 26 may be formed immediately after the through holes 24 are formed.

Figure 6:
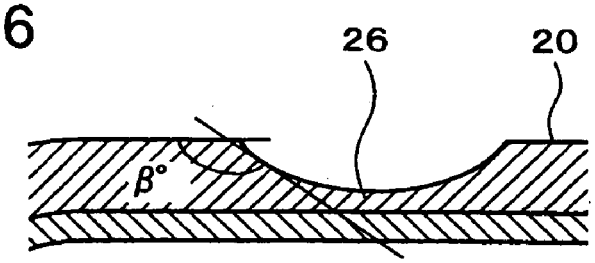
FIG. 6 is an enlarged cross-sectional view of a second concave portion.

FIG. 6 is an enlarged cross-sectional view of one of the second concave portions 26. Each of the second concave portions 26 is formed in such a way that an angle β between an osculating plane at any point of a surface (a tangent at a cross section) of each of the second concave portions 26 and a top surface (a tangent at a cross section) of the wiring layer 20 (specifically, the edge of the opening of each of the second concave portions 26), with the angle β being defined outside each of the second concave portions 26, is 90° or more. Each of the second concave portions 26 may have a curved outline, as shown in FIG. 6, at a cross section taken along a plane perpendicular to a top surface of the wiring layer 20 (specifically, the edge of the opening of each of the second concave portions 26). Each of the second concave portions 26 may have a surface with a gentle curve or have a width that decreases with its depth. Each of the first concave portions 26 may have no corners in its surface.

Figure 7:
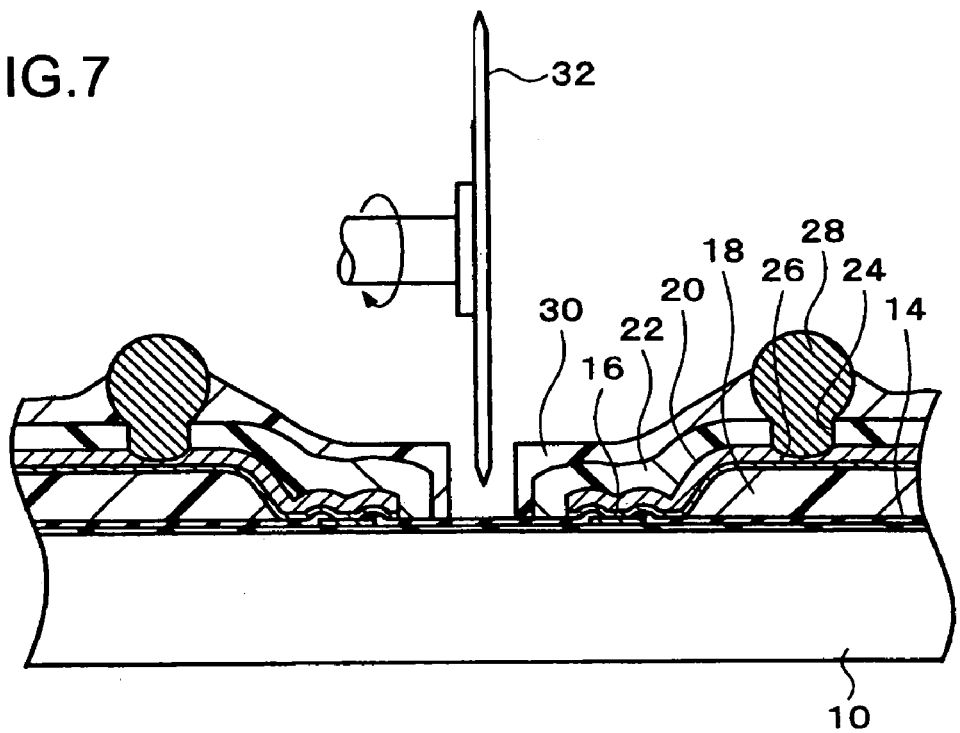
FIG. 7 is an illustration explaining a method for manufacturing a semiconductor device according to an embodiment of the present invention.

As shown in FIG. 7, external terminals 28 are provided. The external terminals 28 are provided in the second concave portions 26 of the wiring layer 20. The external terminals 28 are joined to the second concave portions 26. The external terminals 28 may contact the through holes 24 in the first resin layer 22. The external terminals 28 may be formed of soft solder or hard solder. As the soft solder, solder free from lead (hereinafter referred to as lead-free solder) may be employed. As the lead-free solder, an alloy of tin and silver (Sn—Ag), an alloy of tin and bismuth (Sn—Bi), an alloy of tin and zinc (Sn—Zn), or an alloy of tin and copper (Sn—Cu) may be employed. To such an alloy, at least one of silver, bismuth, zinc, and copper may be added. The external terminals 28 may be provided by the known art.

As shown in FIG. 7, a second resin layer 30 may be formed on the first resin layer 22. The description given above for the stress relief layer 18 is also applicable to the second resin layer 30. The second resin layer 30 surrounds the external terminals 28. The second resin layer 30 may cover a part of each of the external terminals 28 (e.g., the base thereof). The second resin layer 30 may cover (e.g., completely) the first resin layer 22. The second resin layer 30 may be subjected to patterning, after being formed entirely covering the semiconductor substrate 10. After the second resin layer 30 is formed covering the external terminals 28, parts of the second resin layer 30, which are formed on the upper ends of the external terminals 28, may be removed. For the pattering, the description given above for the stress relief layer 18 is also applicable. Alternatively, the second resin layer 30 may be partly removed by the use of a laser or by ashing.

A semiconductor wafer according to an embodiment of the present invention includes the semiconductor substrate 10. The semiconductor substrate 10 has the plurality of integrated circuits 12 (see FIG. 1), and has the pads 16 on its surface. The pads 16 are electrically connected to the integrated circuits 12. The wiring layer 20 is electrically connected to the pads 16. The first resin layer 22 is formed on the wiring layer 20. The external terminals 28 are provided on the wiring layer 20. The second resin layer 30 may surround the external terminals 28. The first resin layer 22 has the through holes 24. The wiring layer 20 has the second concave portions 26. The through holes 24 and the second concave portions 26 may overlap each another. The openings of the second concave portions 26 may be entirely disposed inside the through holes 24. The external terminals 28 may contact the through holes 24 in the first resin layer 22.

As shown in FIG. 6, each of the second concave portions 26 is formed in such a way that an angle β between an osculating plane at any point of a surface (a tangent at a cross section) of each of the second concave portions 26 and a top surface (a tangent at a cross section) of the wiring layer 20 (specifically, the edge of the opening of each of the second concave portions 26), with the angle β being defined outside each of the second concave portions 26, is 90° or more. Therefore, breaks in the wiring layer 20 are reduced.

In this embodiment, the external terminals 28 are joined to the second concave portions 26. Therefore, the second concave portions 26 allow the junction between the wiring layer 20 and the external terminals 28 to have high strength.

The second concave portions 26 increase contact areas between the wiring layer 20 and the external terminals 28, thus improving the performance of the electrical connection between the wiring layer 20 and the external terminals 28. Other details are as described above.

As shown in FIG. 7, the semiconductor substrate 10 is subjected to cutting (e.g., scribing or dicing) by a cutter (a blade) 32 or the like. In this way, a semiconductor device is obtained.

Figure 8:
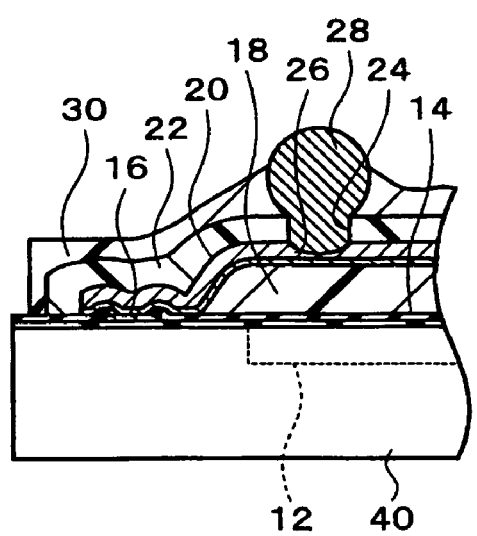
FIG. 8 is a partial enlarged view taken along the line VIII—VIII of FIG. 9.
Figure 9:
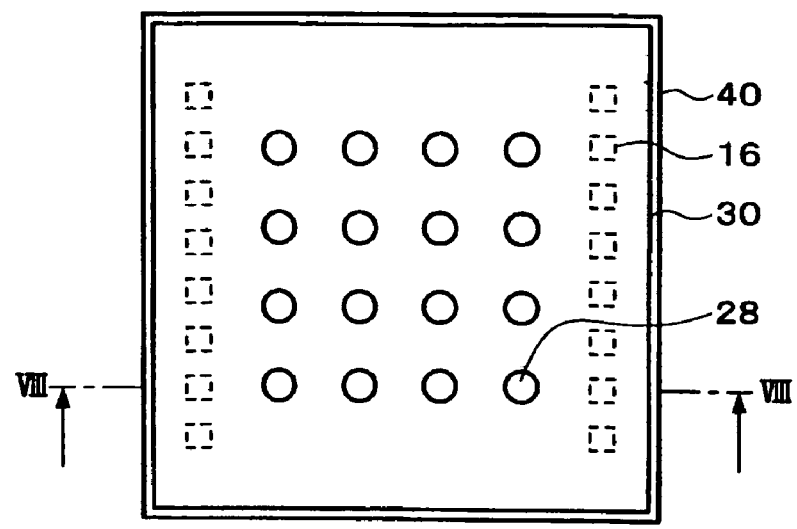
FIG. 9 is an illustration of a semiconductor device according to an embodiment of the present invention.

FIGS. 8 and 9 are illustrations of a semiconductor device according to an embodiment of the present invention. FIG. 8 is a cross-sectional view taken along the line VIII—VIII of FIG. 9. The semiconductor device includes a semiconductor chip 40. The semiconductor chip 40 may be cut from the semiconductor substrate 10. For other details of the semiconductor device, the description given above for the semiconductor wafer is also applicable here.

Figure 10:
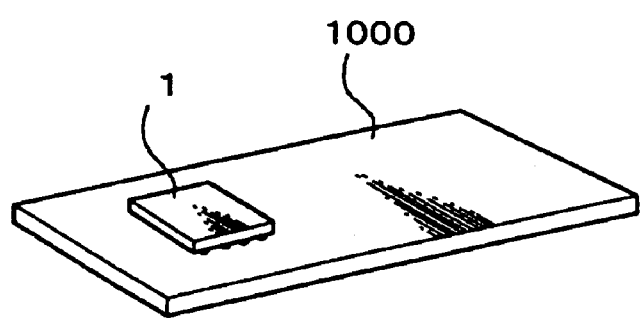
FIG. 10 is an illustration of a circuit board on which the semiconductor device according to an embodiment of the present invention is mounted.
Figure 11:
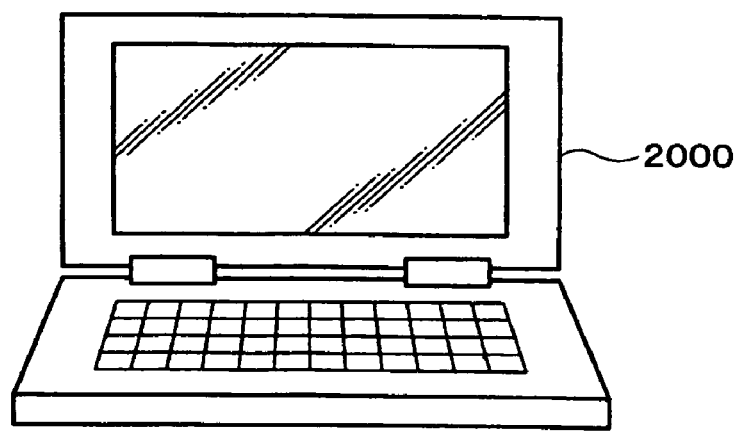
FIG. 11 is an illustration of an electronic instrument having the semiconductor device according to an embodiment of the present invention.
Figure 12:
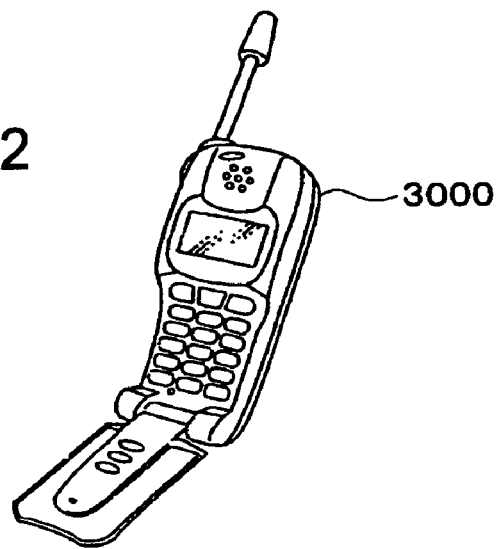
FIG. 12 is an illustration of an electronic instrument having the semiconductor device according to an embodiment of the present invention.

FIG. 10 shows a circuit board 1000 on which a semiconductor device 1, which is described in the above embodiment, is mounted. As electronic instruments, each having this semiconductor device, FIGS. 11 and 12 show a notebook personal computer 2000 and a mobile phone 3000, respectively.

The present invention is not restricted to the embodiments described above so that various modifications may be made. For example, the present invention includes substantially the same arrangements as those described in the embodiments (e.g., arrangements having the same functions, the same methods, and the same results, or arrangements having the same purposes and the same results). The present invention further includes arrangements in which inessential parts are replaced in the arrangements described in the embodiments. The present invention further includes arrangements capable of offering the same operational advantages or achieving the same purposes as those described in the embodiments. The present invention further includes arrangements in which publicly known art is added to the arrangements described in the embodiments.

What is claimed is:

1. A method for manufacturing a semiconductor device comprising the steps of:
    (a) forming a wiring layer on a semiconductor substrate having an integrated circuit and a pad electrically connected to the integrated circuit, the wiring layer being electrically connected to the pad;
    (b) forming a resin layer covering the wiring layer;
    (c) forming a first concave portion at an area of the resin layer, the area overlapping the wiring layer, by a first process, the first process comprising an exposure step wherein a portion of the resin layer is irradiated with a dose of radiation to form a region with increased solubility and a development step wherein a portion of the region with increased solubility is removed to form the concave portion;
    (d) forming a through-hole in the resin layer by removing a bottom of the first concave portion by a second process, the second process differing from the first process, and forming a second concave portion in the wiring layer in such a way that an angle between an osculating plane at any point of a surface of the second concave portion and a top surface of the wiring layer, with the angle being defined outside the second concave portion is 90° or more; and
    (e) providing an external terminal in the second concave portion of the wiring layer.

2. The method for manufacturing the semiconductor device according to claim 1, wherein, in step (c), the first concave portion is formed in such a way that an angle between an osculating plane at any point of a surface of the first concave portion and a top surface of the resin layer, the angle being defined outside the first concave portion, is 90° or more.

3. The method for manufacturing the semiconductor device according to claim 1 or claim 2, wherein, in step (b), the resin layer is formed of a thermosetting resin precursor and,
    prior to step (d), the thermosetting resin precursor is heated.

4. The method for manufacturing the semiconductor device according to claim 1, wherein the resin layer is formed of a resin precursor that is sensitive to radiation, and
    the first process includes irradiation with the radiation and development of the resin precursor.

5. The method for manufacturing the semiconductor device according to claim 1, wherein the second process comprises dry etching.

6. The method for manufacturing the semiconductor device according to claim 1, wherein the resin layer is formed of a solder resist.

7. The method for manufacturing the semiconductor device according to claim 1, wherein the first concave portion has a curved outline at a cross section taken along a plane perpendicular to a top surface of the resin layer.

8. The method for manufacturing the semiconductor device according to claim 1, wherein the second concave portion has a curved outline at a cross section taken along a plane perpendicular to a top surface of the wiring layer.

9. The method for manufacturing the semiconductor device according to claim 1, wherein the first concave portion has a width that decreases with depth.

10. The method for manufacturing the semiconductor device according to claim 1, wherein the second concave portion has a width that decreases with depth.

11. The method for manufacturing the semiconductor device according to claim 1, wherein the second concave portion is formed in such a way that an opening thereof is entirely disposed inside the through-hole.

12. The method for manufacturing the semiconductor device according to claim 1, wherein, during the exposure step of the first process, the resin layer is irradiated with a sufficient dose of radiation that reaches a part of the resin layer in contact with the wiring layer so as to form the region with increased solubility.

13. The method for manufacturing the semiconductor device according to claim 1, wherein the region with increased solubility comprises straight walls.

14. The method for manufacturing the semiconductor device according to claim 1, wherein, during the development step of the first process, a developer is supplied to the region with increased solubility to penetrate the surface of the resin layer to a depth that gradually decreases from a center portion of the region with increased solubility to an edge portion of the region with increased solubility to thereby form the first concave portions with a concave contour.

15. A semiconductor device comprising:
    a semiconductor chip having an integrated circuit and a pad electrically connected to the integrated circuit;
    a wiring layer electrically connected to the pad and having a concave portion, the concave portion being formed in such a way that an angle between an osculating plane at any point of a surface of the concave portion and a top surface of the wiring layer, the angle being defined outside the concave portion, is 90° or more;
    an external terminal joined to the concave portion of the wiring layer; and
    a resin layer provided on the wiring layer, the resin layer having a through-hole, the through-hole and the concave portion overlapping each other, the concave portion being formed by an exposure step wherein a portion of the resin layer is irradiated with a dose of radiation to form a region with increased solubility and a development step wherein a portion of the region with increased solubility is removed to form the concave portion.

16. The semiconductor device according to claim 15, wherein the concave portion has a curved outline at a cross section taken along a plane perpendicular to a top surface of the wiring layer.

17. The semiconductor device according to claim 15 or claim 16, wherein the concave portion has a width that decreases with depth.

18. The semiconductor device according to claim 15, wherein the concave portion is formed in such a way that an opening thereof is entirely disposed inside the through-hole.

19. The semiconductor device according to claim 15, wherein the external terminal contacts the through-hole in the resin layer.

20. The semiconductor device according to claim 15, further comprising:
    a stress relief layer formed on or above the semiconductor chip,
    wherein the wiring layer is formed on or above the stress relief layer.

21. The semiconductor device according to claim 15, wherein the resin layer is formed of a solder resist.

22. A circuit board including the semiconductor device according to claim 15.

23. An electronic instrument including the semiconductor device according to claim 15.

24. A semiconductor wafer comprising:
- a semiconductor substrate having a plurality of integrated circuits and pads electrically connected to the plurality of integrated circuits;
- a wiring layer electrically connected to the pads and having concave portions, the concave portions being formed in such a way that an angle between an osculating plane at any point of a surface of each of the concave portions and a top surface of the wiring layer, the angle being defined outside each of the concave portions, is 90° or more;
- external terminals joined to the concave portions in the wiring layer; and
- a resin layer provided on the wiring layer, the resin layer having through holes, the through holes and the concave portions overlapping each other, the concave portions being formed by an exposure step wherein a portion of the resin layer is irradiated with a dose of radiation to form a region with increased solubility and a development step wherein a portion of the region with increased solubility is removed to form the concave portions.

25. The semiconductor wafer according to claim 24, wherein
- each of the concave portions has a curved outline at a cross section taken along a plane perpendicular to a top surface of the wiring layer.

26. The semiconductor wafer according to claim 24 or claim 25, wherein each of the concave portions has a width that decreases with depth.

27. The semiconductor wafer according to claim 24, wherein the concave portions are formed in such a way that openings thereof are entirely disposed inside the through holes.

28. The semiconductor wafer according to claim 24, wherein the external terminals contact the through holes in the resin layer.

29. The semiconductor wafer according to claim 24, further comprising:
- a stress relief layer formed on or above the semiconductor substrate,
- wherein the wiring layer is formed on or above the stress relief layer.

30. The semiconductor wafer according to claim 24, wherein the resin layer is formed of a solder resist.

* * * * *